United States Patent [19]
Uhlenhoff et al.

[11] Patent Number: 5,285,148
[45] Date of Patent: Feb. 8, 1994

[54] CURRENT-REGULATING CIRCUIT HAVING PARALLEL CONTROL PATHS

[75] Inventors: Arnold Uhlenhoff, Emmendingen; Ulrich Theus, Gundelfingen, both of Fed. Rep. of Germany

[73] Assignee: Deutsche ITT Industries GmbH, Freiburg, Fed. Rep. of Germany

[21] Appl. No.: 932,475

[22] Filed: Aug. 20, 1992

[30] Foreign Application Priority Data

Aug. 23, 1991 [GB] United Kingdom ............... 91114120

[51] Int. Cl.$^5$ ............................................. G05F 1/613
[52] U.S. Cl. .................................. 323/272; 323/282; 323/316
[58] Field of Search ............... 323/268, 269, 272, 273, 323/282, 316

[56] References Cited

U.S. PATENT DOCUMENTS

| | | | |
|---|---|---|---|
| 2,906,941 | 9/1959 | Brolin | 323/269 |
| 3,237,087 | 2/1966 | Greenberg | 323/269 |
| 3,675,114 | 7/1972 | Nercessian | 323/269 |
| 4,290,007 | 9/1981 | Fisher et al. | 323/269 |
| 4,859,875 | 8/1989 | Tihanyi et al. | 307/311 |

FOREIGN PATENT DOCUMENTS

| | | | |
|---|---|---|---|
| 0374321 | 12/1981 | Austria | H03K 17/687 |
| 0304951 | 8/1988 | European Pat. Off. | H03K 17/04 |
| 0523266 | 7/1991 | European Pat. Off. | G05F 3/26 |
| 3405936 | 8/1985 | Fed. Rep. of Germany | H02M 1/08 |
| 3611548 | 10/1987 | Fed. Rep. of Germany | G05F 3/26 |

OTHER PUBLICATIONS

Designer's Casebook; Parallel Power MOD FETs Increase Circuit Current Capacity; Herb Saladin and Al Pshaenich; 8032 Electronics International; vol. 55 (1982) Apr., No. 7, New York, USA; pp. 136–137.

Primary Examiner—Steven L. Stephan
Assistant Examiner—Jeffery Sterrett
Attorney, Agent, or Firm—Thomas L. Peterson

[57] ABSTRACT

The present invention is a circuit for regulating the current across an impedance load. This current regulating circuit is comprised of a main current path including a first control path, a reference-current path including a similar, second control path, and a control means including a pulse generator, a current source controller and an operational amplifier for controlling the first and second control paths in parallel.

20 Claims, 2 Drawing Sheets

CURRENT-REGULATING CIRCUIT HAVING PARALLEL CONTROL PATHS

FIELD OF THE INVENTION

The present invention relates to current-regulating circuits and more particularly to a current-regulating circuit having parallel control paths by which the voltage drop across the control path is minimized and by which pulsed operation with regulated-current amplitude is made possible in order to save current and minimize power dissipation.

BACKGROUND OF THE INVENTION

Current regulating circuits are well-known in the art. Examples of such circuits are found in German Patent DE 34,05,936 A1, Austrian Patent 374,321, and European Patent 0,304,951. In addition, in "Electronics International" Vol. 55, No. 7, April 1982, pages 136 to 137, an article entitled "Parallel Power MOS FETs Increase Circuit Current Capacity" further discusses such circuits. One common application of such current-regulating circuits is in remote-control transmitters with an infrared diode as the emitting device used, for example, to control televisions and other consumer electronic products. Since such remote-control transmitters are generally battery operated, the transmitting power of the infrared output stage is heavily dependant upon the respective battery condition. A current regulating circuit is necessary to conserve the battery power and to maintain relatively constant transmitting power. However, most conventional current-regulating circuits suffer from the drawback that a considerable part of the supply voltage across the control path is lost in devices for sensing the respective current. This reduces the extent of utilization of the battery's capacity and diminishes the transmitting power at an early time as the battery voltage decreases.

It is, therefore, an object of the present invention as claimed to provide a current-regulating circuit for a resistive load whose current-sensing device and regulating circuit are designed so that the voltage drop across the control path is minimized. The voltage requirement of the controller of the control path must, accordingly, not be greater than the voltage drop across the series combination of the resistive load and control path.

It is a further object of the present invention to improve the operation of the current-regulating circuit so that pulsed operation with regulated current amplitude is possible, with the turn-on and turn off edges of the current pulses being as steep as possible so that the individual pulses can be kept as narrow as possible in order to save current and minimize power dissipation, and in addition, to achieve high transmission frequency.

SUMMARY OF THE INVENTION

The present invention is a circuit for regulating the current across an impedance load. This current regulating circuit is comprised of a main current path including a first control path, a reference-current path including a similar, second control path, and a control means including a pulse generator, a current source controller and an operational amplifier for controlling the first and second control paths in parallel.

The current-regulating circuit of the present invention has the following additional features: the main current path includes between a first supply terminal and a current input of the first control path a low-impedance load whose current is to be regulated; the reference-current path includes a high-impedance current source having its output coupled to the current input of the second control path, and the control means includes an operational amplifier in the form of a differential amplifier whose inverting and noninverting inputs are coupled to the current inputs of the first and second control paths.

BRIEF DESCRIPTION OF THE FIGURES

For a better understanding of the present invention, reference is made to the following description of an exemplary embodiment thereof, considered in conjunction with the accompanying drawings, in which.

DETAILED DESCRIPTION OF THE DRAWINGS

Figure 1:
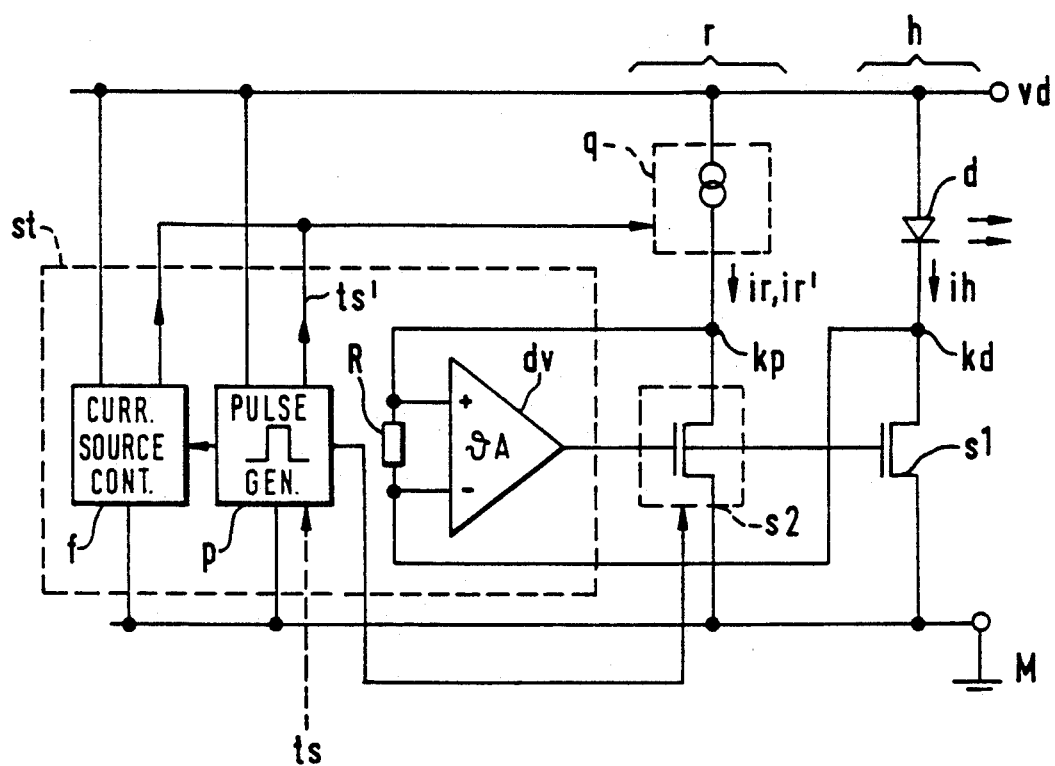
FIG. 1 is a block diagram for one exemplary embodiment of the current-regulating circuit with devices for pulse control in accordance with the invention.

The block diagram of the current-regulating circuit of FIG. 1 shows a main current path h, a parallel reference-current path r, and a control means st. The control means st includes an operational amplifier in the form of a differential amplifier (OA) dv which drives both a first control path s1 and a second control path s2 associated with the main current path h and the reference-current path r, respectively. The main current path contains a series combination of a low-impedance load and the first control path s1 between a supply terminal vd and a ground terminal M. In FIG. 1, the low-impedance load is an infrared-emitting diode d. The load may, of course, be any device that consumes electric power or any current-driven element, such as a hot-wire sensor or a crossed-coil instrument.

The first control path s1 and the second control path s2, which paths are parallel to one another, are controlled by the output of the differential amplifier dv. The current input kp of the second control path is fed with a reference current ir from a current source q.

The invention makes use of the effect that if identical control paths are controlled in the same way at the control inputs and have the same voltage at the control inputs, the currents flowing through these control paths will be equal. For different, but similar control paths, the ratio of the respective control currents is equal to the extent of the control of each path. Each path can be switched independently, and hence opened and closed for a different period of control or actuation. Thus, this control or actuation determines the current which flows through the respective impedance load.

This actuating action in switching the control paths open and closed should, as far as possible, be purely voltage or current-controlled. The voltage controlled actuating quantity will hereinafter be expressed as "transconductance", used to designate the relationship between the control path current and the control voltage; the term is not intended to be limited to small-signal behavior. The current-controlled actuating quantity will hereinafter be expressed as "current gain", defined as the ratio between the control-path current and the control current; this term is, likewise, not intended to be limited to small-signal behavior.

If field-effect transistors are used for the control paths, the respective transconductance transistor so used will be determined by the ratio of the channel-width of the transistor to the channel-length (W/L). In order to obtain proportional actuating quantities between the first and second control paths, the channel length L of the transistors in the first and second control paths are made to be equivalent, such that the ratio of the respective transconductances of said first and second control paths is defined by the ratio of the channel widths W1:W2. In a simple embodiment using bipolar technology, this corresponds to the ratio of the respective base-emitter areas. In the case of purely current-driven control paths, e.g., in current mirror circuits with fixed current ratios, the respective current gain is dependent upon the main current ih and the reference current ir.

The differential amplifier dv senses the voltage difference between the current inputs kd and kp of the first and second control paths s1 and s2 and adjusts the two control paths until the voltage difference between the paths is zero. In FIG. 1, as a result of the high internal resistance of the current source q, the negative feedback loop via the reference-current path r has a higher gain than the positive-feedback loop via the main current path h through the low-impedance load d.

In FIG. 1, a pulse switching stage (PULSE GEN.) p and a current source controller or precharging device (CURRENT SOURCE CONT.) f are shown schematically within the control means st. By means of an externally applied pulse control signal ts or an internal pulse generator, the pulse switching stage generates control signals ts' which can turn the current source q on and off, and can therefore turn the main current ih on and off. In the case of a remote-control transmitter with an infrared-emitting diode d, the main current ih will be of the order of 1 ampere. If field-effect transistors are employed, this requires a very large transistor for the first control path s1. The input capacitance of this transistor delays the control action during pulsed operation, so that the leading and trailing edges of such pulse will rise and fall as a function of this capacitance and, in addition, will be delayed with respect to the control signals from the switching stage. The constant recharging of the control-path capacitance in this manner can be considerably reduced by means of the precharging device f. Through this device, the first control path s1 is kept in a precharge condition during the intervals between pulses, which keeps the first control path open for a small precharging current. This is accomplished by the two following complementary steps: first, the current source q is not completely turned off but is switched to a small precharge reference current ir'; and second, an auxiliary control path t2' (see FIG. 2), which increases the transconductance or current gain of the second control path s2, e.g., by a factor of 5, is connected in parallel with the second control path s2. According to both the magnitude of the precharge reference current ir' and the new actuating-quantity ratio between the first and second control paths, the desired precharging current appears in the main current path h.

The resistor R between the inverting and noninverting inputs of the differential amplifier dv serves to stabilize the circuit by reducing the loop gain in a simple manner.

Figure 2:
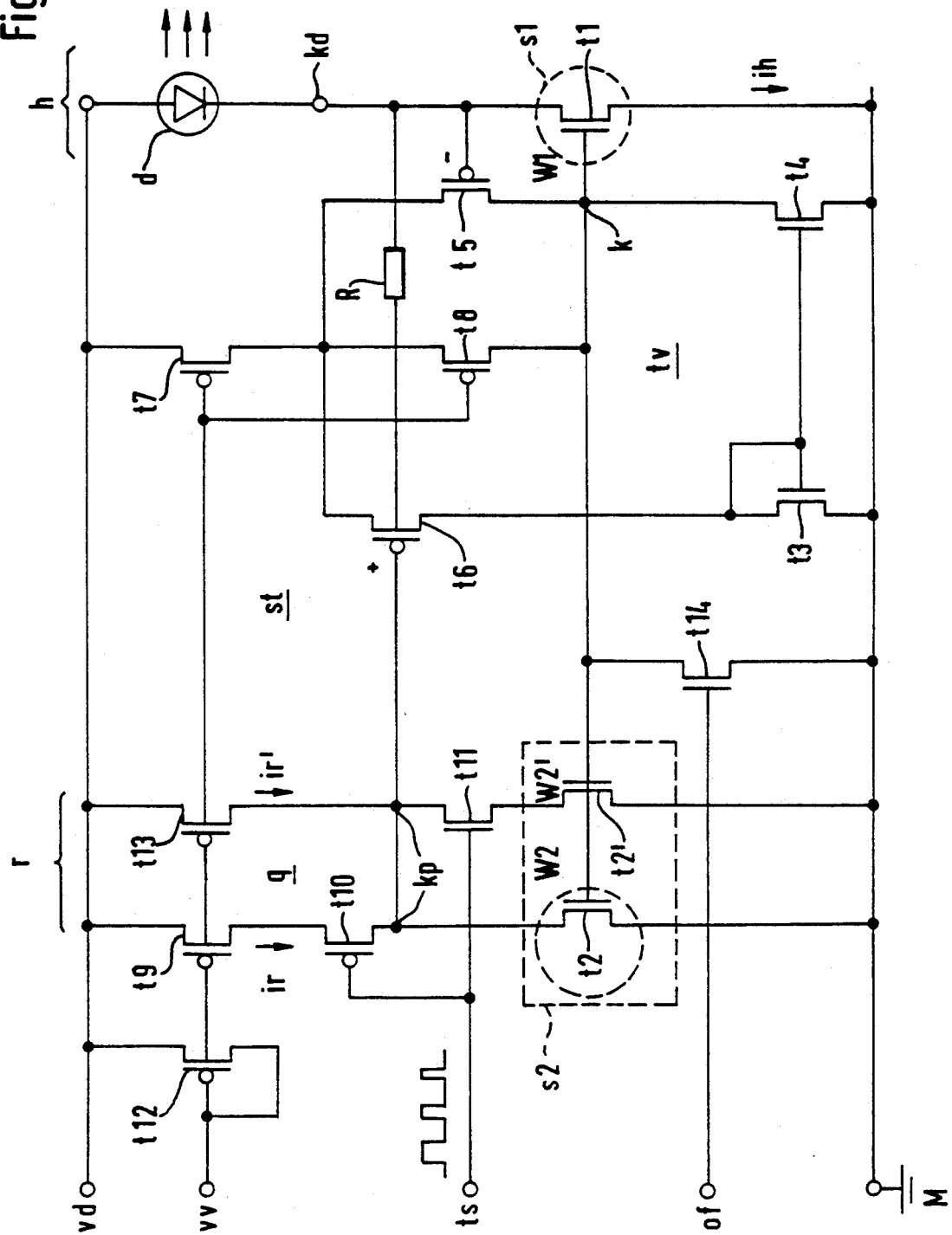
FIG. 2 is a circuit diagram of an exemplary embodiment of the current regulating circuit in CMOS technology.

FIG. 2 shows a preferred embodiment of the current-regulating circuit in CMOS technology. The first and second control paths s1 and s2 are formed, for example, by a first n-channel transistor t1 with a W/L ratio of, e.g., 180,000/1.5 and a second n-channel transistor t2 with a W/L ratio of, e.g., 160/1.5. The auxiliary control path, implemented with an n-channel transistor t2', has a W/L ratio of 1000/1.5. The gate terminals of these three transistors t1, t2 and t2' are connected to an output terminal k of a transconductance amplifier tv, which is formed from n-channel transistors t3 and t4 and p-channel transistors t5 and t6, and serves as the differential amplifier dv. The gate terminal of the p-channel transistor t5 forms the inverting input of said transconductance amplifier tv, which inverting input is connected to the terminal kd for the load in the main current path h. Also connected to the terminal kd is the drain terminal of the n-channel transistor t1.

The gate terminal of the p-channel transistor t6 forms the noninverting input of the transconductance amplifier tv, which is connected to the current input kp of the second control path s2. The current source q, which is connected between the supply terminal vd and the current input kp of the second control path s2, generates a reference current ir of, e.g., 850 microamperes, by means of a p-channel transistor t9, and a precharge reference current ir' of, e.g., 70 microamperes, by means of an additional p-channel transistor t13. The drain current of the transistor t9 flows through a current switch t10 implemented with a p-channel transistor whose gate terminal is controlled by the pulse control signal ts, so that the reference current ir can be switched off ahead of the current input kp of the second control path.

The interconnected drain terminals of the transistors t10 and t13 are connected to the noninverting input of the transconductance amplifier tv, to the drain terminal of the transistor t2, and to the drain terminal of the n-channel transistor t11, whose gate terminal is supplied with the pulse control signal ts. The transistors t10 and t11 are oppositely switched on or off by the pulse control signal ts. The source terminal of the n-channel transistor t11 is connected to the drain terminal of the n-channel transistor t2', which forms the auxiliary current path.

When the reference current ir is switched off, the precharge reference current ir' flows through the node kp directly to the transistor t2 and through the conducting transistor t11 to the transistor t2'. This precharge reference current is divided between the transistors t2 and t2' according to the ratio of W2:W2'. When the precharge reference current ir' flows through node kp, the transconductance of the second control path s2, is determined from the sum of W2/L and W2'/L, i.e., 1160/1.5. With a precharge reference current ir' of 70 microamperes, this gives a precharging current of about 10 milliamperes in the main current path. Thus, during pulsed operation, the main current ih is switched between 1 ampere and 10 milliamperes. The precharge current does not load the battery during intervals between pulses. As mentioned above, extremely short pulses, with a duration of about 1 microsecond are desirable.

From the embodiment shown in FIG. 2 it is apparent that in the presence of a pulse, the reference-current path r supplies the sum of the drain currents of the transistors t9 and t13 to the second control path s2. This, however, can be easily taken into account in the current ratio of reference-current path to main current path. On the other hand, the precharge reference current ir' is prevented from flowing into node kp in the presence of a pulse by means of the n-channel switch, transistor t11, controlled by the pulse control signal ts.

The transconductance amplifier tv and the current source q are supplied with current through a p-channel current bank whose common gate potential is applied at a bias terminal vv. The common source terminal of the p-channel transistors t5 and t6 is fed from a p-channel transistor t7 of the p-channel current bank, which has another p-channel transistor t8 connected to it in a cascode configuration. The drain electrode of this p-channel transistor t8 feeds the output terminal k with a steady-state precharging current. The common gate potential of the p-channel current bank and, hence, the level of the bias voltage vv are determined by a p-channel transistor t12, whose gate-drain terminal is connected to the common gate interconnecting line and whose source terminal is connected to the supply terminal vd. The current source connected to the bias terminal vv is not shown in FIG. 2.

The entire pulse control with precharging is deactivated by a turn-off signal of. When this signal is at an upper switching level, the output terminal k is grounded through an n-channel transistor t14. The transistor t14 also causes the control path transistor t1 to be turned fully off, so that only a leakage current can flow through the diode d.

Stabilization of the control system including the transconductance amplifier tv is achieved like in FIG. 1 by means of a resistor R which is connected between the inverting and noninverting inputs of the transconductance amplifier tv and has a value of, e.g., 3 kilohms.

It will be understood that the embodiment described herein, including the current and resistor values given and the given widths and lengths of the various transistor channels, is merely exemplary and that a person skilled in the art may make many variations and modifications to the described embodiment utilizing functionally equivalent elements to those described. More specifically, it should be understood that any control means can be used in place and instead of the control means described herein. Any variations or modifications to the invention just described are intended to be included within the scope of said invention as defined by the appended claims.

We claim:

1. A current-regulating circuit, comprising:
a main current path between a first point of reference potential and ground, wherein said main current path includes a first control path in series with an impedance load;
a reference current path between said first point of reference potential and ground, wherein said reference current path includes a second control path in series with a current source; and
a control means for regulating the current in said main current path by controlling said first and second control paths in parallel, wherein said control means includes an operational amplifier having an inverting input coupled to said first control path and noninverting input coupled to said second control path.

2. The current-regulating circuit according to claim 1, wherein said operational amplifier is a differential amplifier.

3. The current-regulating circuit according to claim 1, wherein said impedance load is a light emitting diode.

4. The current-regulating circuit according to claim 1, wherein said control means further includes a pulse switching stage which generates the current in said main current path as pulses with regulated amplitude.

5. The current-regulating circuit according to claim 1, wherein:
during intervals between pulses, said pulse switching stage activates a precharging device causing said first control path to be in a precharge condition.

6. The current-regulating circuit according to claim 1, wherein:
said first and second control paths are implemented using n-channel field-effect transistors; and
the ratio of the transconductance or current gain of said first control path to the transconductance or current gain of said second control path is equivalent to the ratio of the current in said main current path to the current in said reference current path.

7. The current-regulating circuit according to claim 1, wherein:
during intervals between pulses, said pulse switching stage switches the transconductance or current gain of said second control path to a second value which is greater than the value during the pulse time, and;
during intervals between pulses, said current source, which is controlled by said pulse switching stage, feeds said second control path with a precharge reference current whose value is less than that of said reference current.

8. The current-regulating circuit according to claim 1, wherein:
switching of the transconductance or current gain of said second control path is effected by coupling an auxiliary second control path in parallel with said second control path.

9. The current-regulating circuit according to claim 1, wherein said precharing device is deactivated by a turn-off signal.

10. The circuit-regulating circuit according to claim 1, wherein said circuit is implemented in CMOS technology.

11. A current-regulating circuit, comprising:
a main current path including a first control path, wherein said main current path further includes between a first supply terminal and a current input of said first control path, a low impedance load whose current is to be regulated;
a reference-current path including a second control path, wherein said reference-current path includes a high-impedance current source which supplies a current input of said second control path with a reference current, said main current path and reference-current path being connected in parallel; and
a control means serving to control said first and second control paths in parallel, wherein said control means includes a regulating amplifier whose inverting input is coupled to said current input of said first control path, and whose noniverting input is coupled to said current input of said second control path.

12. The current-regulating circuit according to claim 11, wherein
said first and said second control paths are implemented using monolithic integrated circuit technology; and
the ratio of the transconductance or current gain of said first control path to the transconductance or current gain of said second control path is equivalent to the ratio of the current in the main current path to the current in the reference current path.

13. The current-regulating circuit according to claim 12, wherein:
said control means includes a pulse switching stage which generates a current in said main current path as pulses with regulated amplitude.

14. The current-regulating circuit according to claim 13, wherein:
during intervals between pulses, said pulse switching stage activates a precharging device which causes said first control path to be in a precharge condition.

15. The current-regulating circuit according to claim 14, wherein:
during intervals between pulses, said pulse switching stage switches the transconductance or current gain of said second control path to a second value which is greater than the value during the pulse time, and;
during intervals between pulses, said current source, which is controlled by said pulse switching stage, feeds said second control path with a precharge reference current whose value is less than that of said reference current.

16. The current-regulating circuit according to claim 15, wherein:
switching of transconductance or current gain of said second control path is effected by connecting an auxiliary second control path in parallel with said second control path.

17. The current-regulating circuit according to claim 16, wherein:
at least part of said current-regulating circuit is implemented using field-effect-transistor technology, and in particular CMOS technology.

18. The current-regulating circuit according to claim 17, wherein: said low-impedance load is an infrared-emitting diode.

19. The current-regulating circuit according to claim 14, wherein:
said precharging device is deactivated by a turn-off signal.

20. The current-regulating circuit according to claim 17, wherein:
said differential amplifier is transconductance amplifier having an output terminal connected to the gate terminals of a first field-effect transistor and a second field-effect transistor, wherein said first and said second field-effect transistors are n-channel transistors which serve as said first and second control paths, respectively.

* * * * *